United States Patent [19]
Higuchi

[11] 4,357,581
[45] Nov. 2, 1982

[54] OSCILLATION CIRCUIT WITH FREQUENCY DEPENDENT ON INCIDENT LIGHT

[75] Inventor: Mitsuo Higuchi, Tokyo, Japan
[73] Assignee: Fujitsu Limited, Kawasaki, Japan
[21] Appl. No.: 210,662
[22] Filed: Nov. 26, 1980
[30] Foreign Application Priority Data
Nov. 27, 1979 [JP] Japan .................. 54-153109
[51] Int. Cl.³ ............................................ H03K 3/353
[52] U.S. Cl. ....................................... 331/66; 331/111
[58] Field of Search ...................... 331/65, 66, 111; 307/271, 311

[56] References Cited
U.S. PATENT DOCUMENTS
2,862,416 12/1958 Doyle .................................. 331/66
3,599,116 8/1971 Spence et al. ................... 331/66 X
3,938,108 2/1976 Salsbury et al. .

Primary Examiner—Siegfried H. Grimm
Assistant Examiner—Edward P. Westin
Attorney, Agent, or Firm—Staas & Halsey

[57] ABSTRACT

An oscillation circuit for providing oscillation frequencies which vary in response to the intensity of incident light rays. The circuit comprises a capacitance for storing charges and a charging circuit; said stored charges being decreased in response to an increase in the intensity of light rays incident on the capacitance; the charging circuit connected to the output of the oscillation circuit; the charging circuit being adapted to charge the capacitance. The oscillation circuit, when adapted to a bootstrap circuit in an EPROM erasable by means of ultraviolet rays, improves the write-in efficiency thereof.

11 Claims, 2 Drawing Figures

OSCILLATION CIRCUIT WITH FREQUENCY DEPENDENT ON INCIDENT LIGHT

BACKGROUND OF THE INVENTION

This invention relates to an oscillation circuit in which the oscillation frequency varies in response to the intensity of light incident thereon, and more particularly to an oscillation circuit for controlling a bootstrap circuit included in an EPROM (Erasable Programable Read Only Memory) which is erasable by means of ultraviolet rays.

In general, a package for mounting an EPROM which is erasable by means of ultraviolet rays is provided with a window for allowing ultraviolet rays to be radiated on the EPROM. During erasing of the stored contents, ultraviolet rays are radiated on the EPROM through the window. However, during writing of data in the EPROM, external light rays may also penetrate through the window to radiate on the EPROM. These external light rays incident on junction capacitances in the bootstrap circuit included in the EPROM may cause leakage of charges stored in the junction capacitances, resulting in the write-in voltage being lowered to a level insufficient to perform the function of writing-in the data. In order to avoid this lowering of the write-in voltage, an oscillation circuit is usually included in the EPROM so that the junction capacitances are repeatedly charged up during writing.

In a conventional oscillation circuit the oscillation frequency is constant regardless of the intensity of the incident light rays; but here there is a disadvantage in that the oscillation frequency may be too high or to low when the incident light rays are relatively feeble or relatively intense, respectively. More particularly, the high potential H and the low potential L are alternately repeated at the output of the oscillation circuit. Each of the high potential levels corresponds to a writing interval. Each of the low potential levels corresponds to a reset interval for charging up the junction capacitances. If the frequency is too high, the sum of the reset intervals becomes too large, so that the writing time is restricted so that data cannot be written in the EPROM. On the contrary, if the frequency is too low, the charges are depleted, due to the external incident light rays as mentioned above, from the junction capacitances, so that the charging-up of the junction capacitances during each reset interval is not sufficient to maintain a voltage high enough to write data in the EPROM, because each writing interval is too long. In both cases, write-in efficiency is deteriorated.

SUMMARY OF THE INVENTION

Accordingly, it is an object of the present invention to provide an oscillating circuit for achieving a high write-in efficiency in an EPROM which is erasable by means of ultraviolet rays.

Another object of the present invention is to provide an oscillating circuit in which the oscillation frequency varies in response to the intensity of incident light, so that optimal write-in efficiency of an EPROM is achieved.

According to the present invention, there is provided an oscillation circuit for providing oscillation frequencies which change in response to the intensity of incident light rays, comprising: a capacitance for storing charges, the charges being decreased in response to the increase in the intensity of light rays incident on the capacitance, a first waveform shaping circuit for converting the change of the voltage across the capacitance to a rapid change of a waveform, a delay circuit for delaying the waveform outputted from the first waveform shaping circuit by a predetermined time, a second waveform shaping circuit for converting the change of the voltage outputted from the delay circuit to a rapid change of a waveform, and a charging circuit connected to the output of the second waveform shaping circuit, for charging the capacitance.

BRIEF DESCRIPTION OF THE DRAWINGS

The invention will now be described by way of an embodiment with reference to the accompanying drawings in which.

DETAILED DESCRIPTION OF THE PREFERRED EMBODIMENT

Figure 1:
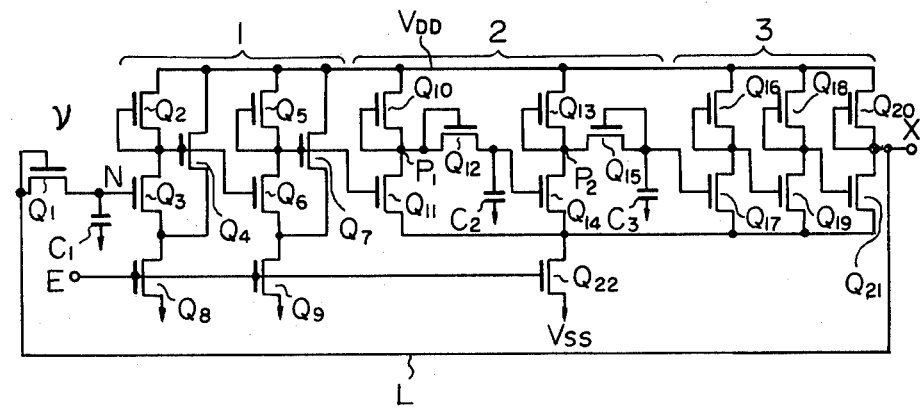
FIG. 1 is a circuit diagram illustrating an oscillating circuit according to an embodiment of the present invention.

Now, referring to FIG. 1, an oscillation circuit according to an embodiment of the present invention is illustrated. In FIG. 1, $Q_1$ represents an MOS transistor for controlling the oscillation frequency; and $C_1$ represents the junction capacitance of the source of the MOS transistor $Q_1$. When external light rays $v$ are incident on the junction capacitance $C_1$, through a window provided with a package for an EPROM, for radiating ultraviolet rays therethrough, the charges stored in the junction capacitance $C_1$ will leak out, causing the voltage across the junction capacitance $C_1$ to sag. The voltage across the junction capacitance $C_1$ is detected by a waveform shaping circuit 1 provided at the input stage of the oscillation circuit. A delay circuit 2 for determining a reset interval of the oscillation circuit is connected to the waveform shaping circuit 1. At the output stage of the oscillation circuit, another waveform shaping circuit 3 is connected to the delay circuit 2.

The waveform shaping circuit 1 at the input stage of the oscillation circuit is comprised of MOS transistors $Q_2$ through $Q_9$. The transistors $Q_2$, $Q_3$ and $Q_8$ are connected in series between a power supply voltage $V_{DD}$ and the ground voltage $V_{SS}$. Also, the transistors $Q_5$, $Q_6$ and $Q_9$ are connected in series between the power supply voltage $V_{DD}$ and the ground voltage $V_{SS}$. The gate and the source of the transistor $Q_2$ are commonly connected to the gate of the transistor $Q_4$ is connected between the power supply voltage $V_{DD}$ and the source of the transistor $Q_3$. Also, the gate and the source of the transistor $Q_5$ are commonly connected to the gate of the transistor $Q_7$ connected between the power supply voltage $V_{DD}$ and the source of the transistor $Q_6$. The set of the transistors $Q_2$ and $Q_3$ constitutes a first inverter circuit. Also, the set of the transistors $Q_5$ and $Q_6$ constitutes a second inverter. Each of the transistors $Q_4$ and $Q_7$ acts as a positive feedback element. The gates of the transistors $Q_8$ and $Q_9$ are connected to an enabling terminal E. When an oscillation enabling signal is applied to the terminal E to turn on the transistors $Q_8$ and $Q_9$ during programming of the EPROM, the waveform shaping circuit 1 is turned on to its operating state. In the operating state of the waveform the shaping circuit 1, when the input voltage varies gradually, that is, when the voltage at the node N connected to the capacitor $C_1$ varies gradually, a rapid change of the waveform is generated at the output of the waveform shaping circuit 1 after the time when the input voltage reaches a predetermined threshold value. Since there are two stages of inverters, the phase of the input signal is the same as that of the output signal. Thus, the waveform of the input signal is shaped by the waveform shaping circuit 1 so that a rectangular wave is obtained at the output of this waveform shaping circuit.

The delay circuit 2 is comprised of MOS transistors $Q_{10}$ through $Q_{15}$ and capacitors $C_2$ and $C_3$. The transistors $Q_{10}$ and $Q_{11}$ connected in series constitute a first buffering inverter. Also, the transistors $Q_{13}$ and $Q_{14}$ connected in series constitute a second buffering inverter. The gate of the transistor $Q_{10}$ is connected to the connecting point $P_1$ between the source of the transistor $Q_{10}$ and the drain of the transistor $Q_{11}$. Also, the gate of the transistor $Q_{13}$ is connected to the connecting point $P_2$ between the source of the transistor $Q_{13}$ and the drain of the transistor $Q_{14}$. The transistor $Q_{12}$ is connected between the connecting point $P_1$ and the gate of the transistor $Q_{14}$. Also, the transistor $Q_{15}$ is connected between the connecting point $P_2$ and the gate of a transistor $Q_{17}$ which is included in the waveform shaping circuit 3. The transistor $Q_{12}$ and the capacitor $C_2$ connected to the source of the transistor $Q_{12}$ constitute a CR time constant circuit. Also, the transistor $Q_{15}$ and the capacitor $C_3$ connected to the source of the transistor $Q_{15}$ constitute another CR time constant circuit. The gate of the transistor $Q_{11}$ is connected to the gate of the transistor $Q_7$.

The waveform shaping circuit 3 is comprised of MOS transistors $Q_{16}$ through $Q_{21}$. Three pairs of the transistors $Q_{16}$ and $Q_{17}$, $Q_{18}$ and $Q_{19}$ and $Q_{20}$ and $Q_{21}$ constitute three stages of inverters. When the input voltage at the gate of the transistor $Q_{17}$ varies gradually, this gradual variaton being caused by the delay circuit 2, a rapid change of waveform is generated at the output X of the waveform shaping circuit 3 after the time when the input voltage at $Q_{17}$ reaches a reference threshold value.

The sources of the transistors $Q_{11}$, $Q_{14}$, $Q_{17}$, $Q_{19}$ and $Q_{21}$ are commonly connected to the drain of an MOS transistor $Q_{22}$, the gate of which is connected to the enabling terminal E, and the source of which is connected to the ground voltage $V_{SS}$.

During the read-out time, the enabling terminal E is turned to a low potential so that the transistors $Q_8$, $Q_9$ and $Q_{22}$ are turned off to cause the circuits 1, 2 and 3 to be inoperative.

In the operation of the circuit of FIG. 1, the oscillation enabling signal is applied to the enabling terminal E to turn on the transistors $Q_8$, $Q_9$ and $Q_{22}$, causing the circuits 1, 2, and 3 to be operative. Since, as mentioned above, the waveform shaping circuit 1 comprises two stages of inverters, including positive feedback transistors, $Q_4$ and $Q_7$, a slowly varying waveform at the input is shaped to a rapidly varying waveform having the same phase as the phase of the input signal. The delay circuit 2 produces at its output a delayed waveform having the same phase as the phase of the input signal. The amount of delay is determined by the two stages of the CR time constant circuits. Since the waveform shaping circuit 3 includes three stages of inverters, the circuit 3 has the function to invert the phase of its input signal, as well as the function to shape the waveform of its input signal. Therefore, the waveform shaping circuit 3 shapes and inverts the output signal of the delay circuit 2 to provide an output signal at the terminal X. The output signal at the terminal X has inverted phase as compared to the input signal at the node N and is delayed by a predetermined time from the input signal. The output signal at the terminal X is fed back through a line L to the drain of the transistor $Q_1$ for oscillation.

The oscillation frequency of this circuit is dependent on the junction capacitance $C_1$. When light rays $\nu$ are incident on the junction capacitance, charges stored in the capacitance $C_1$ leak out so that the voltage at the node N is lowered to a low potential. When the voltage at the node N reaches the threshold voltage of the first stage inverter in the waveform shaping circuit 1, the first stage inverter inverts its state. Then, after a predetermined time determined mainly by the time constant of the delay circuit 2, the output signal at the output terminal X becomes a high potential H. This high voltage is applied to the transistor $Q_1$ to turn it on. Thus, the junction capacitance $C_1$ is charged up by the high voltage H applied through the transistor $Q_1$. After charging the capacitance $C_1$, the voltage at the node N becomes high H so that the voltage at the output terminal X becomes low L after a predetermined time. In this condition, if no light ray is incident on the junction capacitance $C_1$, charges stored in the capacitance $C_1$ hardly leak out, so that the input voltage at the node N is kept at the high level H, causing the oscillation to stop. However, when light rays $\nu$ are incident on the junction capacitance $C_1$ again, charges stored in the capacitance $C_1$ are depleted with a speed corresponding to the intensity of the incident light rays, when the amount of the stored charges become less than a predetermined value, causing the first stage of the inverters in the waveform shaping circuit 1 to invert its state, and after a predetermined time of the time constant of the delay circuit 2, the output voltage at the terminal X of the waveform shaping circuit 3 is turned again to the high level H. Thus, the junction capacitance $C_1$ is again charged by the high voltage H. As long as light rays $\nu$ are incident on the junction capacitance $C_1$, the above described oscillation is effected. The oscillation frequency increases with increase of intensity of the light rays $\nu$, and becomes low with decrease of intensity of the light rays $\nu$. For example, when the period of the oscillation is initially set at 50 through 100 microseconds under the intensity of room light, the period of oscillation may be shortened to about 10 microseconds under relatively intense light rays, and the period of oscillation may be elongated to several ten milliseconds under relatively feeble light rays.

Figure 2:
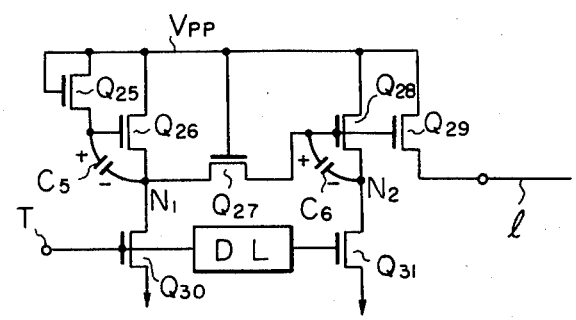
FIG. 2 is a circuit diagram illustrating a part of a write-in circuit in an EPROM which is to be connected to the output of the circuit of FIG. 1.

The circuit of FIG. 1 is utilized to control, for example, a bootstrap circuit as illustrated in FIG. 2, which is included in a PROM (Programable Read Only Memory). In FIG. 2, 1 represents a conduction line, or a bit line, connected to memory cells in the PROM; $V_{PP}$ represents a high power supply voltage of, for example, 25 V for writing data in the PROM; $Q_{29}$ represents a transistor for controlling the power supply voltage $C_{PP}$ to connect to or disconnect from the conduction line 1, the gate of the transistor $Q_{29}$ being controlled by two stages of the bootstrap circuit; $C_5$ and $C_6$ represent the capacitances of the two stages within the bootstrap circuit; $Q_{25}$ through $Q_{28}$ represent the transistors of the bootstrap circuit; $Q_{30}$ and $Q_{31}$ represent transistors for controlling the bootstrap circuit; DL represents a delay circuit; and T represents a control terminal for receiving the oscillation frequency from the output terminal X of the circuit of FIG. 1.

In the operation of the circuit of FIG. 2, when the input voltage at the control terminal T becomes high H, the transistor $Q_{30}$ turns on so that the capacitor $C_6$ is discharged through the transistor $Q_{27}$ and $Q_{30}$ and the capacitance $C_5$ is charged by the power supply voltage $V_{PP}$ through the transistor $Q_{25}$ to have a polarity as illustrated. Also, after a time delay determined by the delay circuit DL, the transistor $Q_{31}$ is turned on. The transistor $Q_{29}$ receives at its gate the voltage across the capacitor $C_6$. However, the voltage across the capacitor $C_6$ when the transistors $Q_{30}$ and $Q_{31}$ are on is not sufficient to turn on the transistor $Q_{29}$. Therefore, when the voltage at the control terminal T is high H, the conduction line 1 is separated from the power supply voltage $V_{PP}$.

When the input voltage at the control terminal T becomes low L, the transistor $Q_{30}$ turns off, so that the potential at the node $N_1$ increases. Since the potential at the gate of the transistor $Q_{26}$ is higher than the potential at the node $N_1$ by the voltage across the capacitance $C_5$, the transistor $Q_{26}$ is driven to be completely turned on. Thus, the potential at the node $N_1$ increases to a voltage nearly equal to the power supply voltage $V_{PP}$; without being decreased by the threshold voltge $V_{TH}$ of the transistor $Q_{26}$. The voltage at the node $N_1$ is applied through the transistor $Q_{27}$ to the capacitance $C_6$ to charge it, as well as to the gate of the transistor $Q_{29}$ to turn it on. Thus, the potential of the conduction line 1 increases. After the time delay of the delay circuit DL, the gate of the transistor $Q_{31}$ receives the low voltage L so that the transistor $Q_{31}$ turns off. Then, the potential at the node $N_2$ increases. The potential at the gate of the transistor $Q_{28}$ then becomes higher than the potential at the node $N_2$ by the voltage across the capacitance $C_6$, resulting in a further increase of the potential at the node $N_2$ to a value nearly equal to the power supply voltage $V_{PP}$. Also, the potential at the gates of the transistors $Q_{28}$ and $Q_{29}$ becomes higher than the potential at the node $N_2$. Then, the transistor $Q_{27}$ switches off. Thus, the potential of the conduction line 1 increases to the power supply voltage $V_{PP}$. This operation, as described with reference to FIG. 2, is well known as a bootstrap operation.

When the potential of the conduction line 1 is high H, or, in other words, when the potential at the control terminal T which receives control signals from the output terminal X of the circuit of FIG. 1 is low L, data are written in the PROM. That is, when the potential of the conduction line is high H, each cell in the PROM receives between its source and drain a high voltage to cause an avalance breakdown in the cell. The avalanche breakdown produces hot electrons or holes which are then injected into the floating gate of the cell.

When data is to be read out from the PROM, the Transistor $Q_{19}$ is turned off so that the conduction line 1 is disconnected from the power supply voltage $V_{PP}$, because, in the reading operation, the potential of the conduction line 1 is not required to be as high as the power supply voltage $V_{PP}$.

The capacitances $C_5$ and $C_6$ in the boostrap circuit of FIG. 2 use for writing data in the PROM are constituted by junction capacitances or MOS capacitances, and therefore, when external light rays are incident on these capacitors $C_5$ and $C_6$, charges stored in these capacitances $C_5$ and $C_6$ will leak out within a time of, for example, about 1 millisecond, while several ten milliseconds are required to write data in the PROM. Therefore, these capacitances are required to be repeatedly charged to maintain the voltage across the capacitance $C_5$ or $C_6$. The frequency with which the charging operation is repeated preferably corresponds to the intensity of the incident external light. That is, if the frequency is too high, the reset intervals or charging intervals disturb the writing as described before, and, if the frequency is too low, the voltage across the capacitors $C_5$ and $C_6$ cannot be maintained.

The delay circuit 2 in the circuit of FIG. 1 determines the reset interval or, in other words, the interval for charging the capacitances $C_5$ and $C_6$ in the bootstrap circuit of FIG. 1, the reset interval being set to, for example, 2 microseconds. In a conventional delay circuit corresponding to the delay circuit of FIG. 1, the gates of the transistors $Q_{12}$ and $Q_{15}$ are connected to the high potential power supply $V_{DD}$. However, with such conventional wiring, since the operations of the delay circuit is the same when the potential at the node N changes from H to L or from L to H, the delay times are the same in both cases. Also, with the conventional wiring, in order to obtain a large CR time constant, it is necessary to enlarge the channel length of the transistor $Q_{12}$ or $Q_{15}$, or to increase the area of the capacitances $C_2$ and $C_3$. In both cases, the area of the circuit is increased.

According to the embodiment of the present invention, as illustrated in FIG. 1, the transistors $Q_{12}$ and $Q_{15}$, used as resistances in the CR time constant circuits, are of a depletion type. Also, the gate is connected to the drain or the source, in the respective transistors $Q_{12}$ and $Q_{15}$. By this construction, the equivalent resistance of the transistors $Q_{12}$ and $Q_{15}$, when the input voltage varies from L to H, or in other words, when the transistor $Q_{11}$ is going to be turned off, is smaller than that when the input voltage varies from H to L. Therefore, with respect to the CR time constant circuit of the transistor $Q_{12}$ and the capacitance $C_2$ the time constant, during which the capacitance $C_2$ is being charged, that is, when the voltage at the connecting point $P_1$ is being increased from L to H, is smaller than the time constant during which the capacitance $C_2$ is being discharged, that is, when the voltage at the connecting point $P_1$ is being decreased from H to L. When the first buffering inverter comprised of the transistors $Q_{10}$ and $Q_{11}$ inverts its input voltage from H to L or L to H, the second buffering inverter comprised of the transistors $Q_{13}$ and $Q_{14}$ inverts its input voltage from L to H or H to L, respectively. Therefore, in contrast to the transistor $Q_{12}$ in the first part of the time delay circuit 2, the gate of the transistor $Q_{15}$ in the second part is connected to the source, that is, to the output of the delay circuit 2, so that the differences in the delay times of both CR time constant circuits are added and not canceled by each other. By this construction of the delay circuit 2 of FIG. 1, the delay time, required to transfer the change from L to H at the node N to the output terminal X as the reverse change from H to L, is larger than the delay time required to transfer the change from H to L at the node N to the output terminal X as the reverse change from L to H. In the circuit of FIG. 1, the interval during which the output terminal X is at H, i.e., the reset interval, should be a predetermined interval (for example, 2 microseconds). To this end, it is preferable that the interval between the transition from L to H at the node N and the transition from H to L at the terminal X is much larger than for the opposite transition. By using the circuit of FIG. 1, a small area circuit can be realized.

The delay circuit 2 is not restricted to the one illustrated in FIG. 1, but may be a conventional delay circuit. When the conventional delay circuit is employed, although the area of the circuit is increased, the write-in efficiency is also improved by the fact that, according to the present invention, the oscillation frequency is changed in response to the intensity of incident light rays v.

Although the second waveform shaping circuit 3 has three stages of inverters in the foregoing embodiment, the number of stages is not restricted to three, but may be any number as long as the phase of the signal at the output of the oscillation circuit is inverted from the phase of the input signal at the input of the first waveform shaping circuit, when the boostrap circuit is such that, as illustrated in FIG. 2, the high potential of the conduction line 1 corresponds ot the low potential at its input T. If the bootstrap circuit is such that the high potential of a conduction line corresponds to the high potential at its input, the phase at the output of te oscillation circuit must, of course, be the same as the phase at the input of the first waveform shaping circuit.

From the foregoing description, since the oscillation frequency of the oscillation circuit according to the present invention can be changed to set its optimum value in response to the intensity of incident light rays, it will be apparent that the write-in efficiency is greatly improved when the oscillation circuit is adapted to, for example, a bootstrap circuit in a PROM of a type erasable by means of ultraviolet rays.

I claim:

1. An oscillation circuit for providing an oscillation frequency which varies in response to the intensity of incident light rays, comprising
    a first capacitor for storing charges, said charges being decreased in response to increase in the intensity of the light rays incident on said first capacitor,
    a first waveform shaping circuit for converting the change of the voltage across said first capacitor to a rapidly changing waveform when said voltage across said capacitor crosses a first predetermined level,
    delay circuit for delaying said rapidly changing waveform outputted from said first waveform shaping circuit by at least one predetermined delay time,
    a second waveform shaping circuit for converting the change of the voltage outputted from said delay circuit to a rapidly changing waveform when said voltage outputted from said delay circuit crosses a second predetermined level, and
    a charging circuit connected to the output of said second waveform shaping circuit, for charging said first capacitor at a time corresponding to said predetermined delay time after said voltage across said capacitor falls below said first predetermined level.

2. The oscillation circuit of claim 1 wherein said second waveform shaping circuit includes means for inverting at its output the phase of the input signal thereto that is output from said delay circuit.

3. The oscillation circuit of claim 1 or 2, said incident light rays being incident through a window for transmitting ultraviolet-ray radiation into an erasable programmable read only memory (EPROM) of a type erasable by means of ultraviolet rays, said EPROM comprising a bootstrap circuit for writing in to the memory cells of said EPROM, said bootstrap circuit comprising capacitors that are discharged by said incident light rays, wherein the output end of said oscillation circuit is connected to an input end of said bootstrap circuit for recharging the capacitors of said bootstrap circuit when said voltage across said first capacitor of said oscillation circuit falls below said first predetermined value.

4. The oscillation circuit of claim 1 wherein said charging circuit is an MOS transistor, the gate and the drain of said MOS transistor being connected to the output end of said oscillation circuit, and the source of said MOS transistor being connected to said first capacitor and to the input of said first waveform shaping circuit.

5. The oscillation circuit as claimed in claim 4 wherein said first capacitor is comprised of the junction capacitance of said MOS transistor.

6. The oscillation circuit of claim 3, comprising means for writing data ito the EPROM when the potential at the input end of said bootstrap circuit is at a low value; said recharging occurring at intervals determined by said delay circuit in response to the rate of decrease of said charges stored in said first capacitor of said oscillation circuit.

7. The circuit of claim 1, wherein said delay circuit comprises at least two stages, each stage comprising a buffering inverter, and time constant circuit, each said time constant circuit having a respective resistor and capacitor.

8. The circuit of claim 7, wherein each said time constant circuit comprises a respective transistor as the resistor of each said time constant circuit.

9. The circuit of claim 8, wherein each said transistor comprising said resistor is a depletion type transistor.

10. The circuit of claim 8 or 9, wherein the gate of said transistor of a first one of said time constant circuits is connected to its drain and the gate of the transistor of the other of said time constant circuits is connected to its source, wherein the delay time for the transmission through the oscillation circuit of the falling portion of the voltage of said first capacitor crossing said first predetermined value is different than the delay time for transmission of the rising portion thereof crossing said first predetermined value.

11. The circuit of claim 10, said delay times for transmssiion of said rising and falling voltages of said first capacitor being such that the transmission of the falling portion of the waveform is longer than the transmission of the rising portion of the waveform.

* * * * *

UNITED STATES PATENT AND TRADEMARK OFFICE
CERTIFICATE OF CORRECTION

PATENT NO. : 4,357,581
DATED : 2 Nov. 1982
INVENTOR(S) : MITSUO HIGUCHI

It is certified that error appears in the above-identified patent and that said Letters Patent is hereby corrected as shown below:

Column 4, line 31, "," should be --.--; "when" should be --When--;

line 58, "Cpp" should be --Vpp--.

Column 5, line 24, "voltge" should be --voltage--;

line 55, "$Q_{19}$" should be --$Q_{29}$--.

Column 6, line 12, "1" should be --2--;

line 37, after "$C_2$" insert --,--; delete "," at end of the line.

Claim 1, line 12, insert --a-- before "delay".

Claim 3, line 6, "in to" should be --into--.

Signed and Sealed this

Twelfth Day of April 1983

[SEAL]

Attest:

GERALD J. MOSSINGHOFF

Attesting Officer     Commissioner of Patents and Trademarks